(12) United States Patent
Hassan et al.

(10) Patent No.: US 10,666,291 B1
(45) Date of Patent: May 26, 2020

(54) HIGH EFFICIENCY DATA DECODER

(71) Applicant: Microsoft Technology Licensing, LLC, Redmond, WA (US)

(72) Inventors: Amer Aref Hassan, Kirkland, WA (US); Russell Andrew Penar, Highlands Ranch, CO (US); Whitney Janice Giaimo, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/351,125

(22) Filed: Mar. 12, 2019

(51) Int. Cl.
*H03M 7/30* (2006.01)
*H03M 7/02* (2006.01)

(52) U.S. Cl.
CPC ........... *H03M 7/6005* (2013.01); *H03M 7/02* (2013.01)

(58) Field of Classification Search
CPC ...... H03M 7/6005; H03M 7/02; H03M 13/15; H03M 13/134; H04L 1/0013; H04L 1/0057
USPC .................................................. 341/70–140
See application file for complete search history.

(56) References Cited

U.S. PATENT DOCUMENTS

| | | | | |
|---|---|---|---|---|
| 6,839,005 B1* | 1/2005 | Singhal | ................... | H03M 7/40 341/67 |
| 7,930,621 B2 | 4/2011 | Zhong | | |
| 8,219,878 B1 | 7/2012 | Varnica et al. | | |
| 8,346,062 B2* | 1/2013 | Takashima | ............. | H04N 5/913 386/254 |
| 8,448,039 B2 | 5/2013 | Gunnam | | |
| 8,952,834 B1* | 2/2015 | Cronie | ..................... | H03M 7/02 341/55 |
| 9,793,923 B2 | 10/2017 | Tao et al. | | |
| 10,254,980 B1* | 4/2019 | Patel | ...................... | G06F 3/0689 |
| 2005/0063344 A1* | 3/2005 | Winzell | ................ | H04L 1/0001 370/335 |
| 2007/0126608 A1* | 6/2007 | Sriram | .................. | H03M 7/425 341/50 |
| 2010/0088575 A1 | 4/2010 | Sharon et al. | | |
| 2012/0119928 A1* | 5/2012 | Yang | ................... | G06F 11/1012 341/94 |

(Continued)

OTHER PUBLICATIONS

Andrews, et al., "LDPC Decoding Using Multiple Representations", In Proceedings of IEEE International Symposium on Information Theory, Jun. 30, 2002, pp. 456.

(Continued)

*Primary Examiner* — Lam T Mai
(74) *Attorney, Agent, or Firm* — Schwegman Lundberg & Woessner, P.A.

(57) ABSTRACT

Disclosed are systems, methods, and non-transitory computer-readable media for a high efficiency data decoder. The high efficiency data decoder accesses an encoded data input from an input device and determines that the encoded data input does not map to any predetermined data outputs from a set of predetermined data outputs. The high efficiency data decoder selects, based on a ranking of modifications for the input device, a modification to perform on the encoded data input. The high efficiency data decoder performs the first modification on the encoded data input, yielding a modified encoded data input. If the modified encoded data input maps to a first data output from the set of predetermined data outputs, the high efficiency data decoder decodes the encoded data input into the first data output.

20 Claims, 8 Drawing Sheets

(56) References Cited

U.S. PATENT DOCUMENTS

| | | | |
|---|---|---|---|
| 2013/0120167 A1* | 5/2013 | Li | H03M 7/30 |
| | | | 341/87 |
| 2013/0135124 A1* | 5/2013 | Soegtrop | H04N 19/42 |
| | | | 341/67 |
| 2015/0131800 A1* | 5/2015 | Mundt | G10L 19/008 |
| | | | 381/22 |
| 2016/0013814 A1 | 1/2016 | Cideciyan et al. | |
| 2016/0149587 A1* | 5/2016 | Mulder | H03M 7/165 |
| | | | 341/96 |
| 2017/0222662 A1 | 8/2017 | Kumar et al. | |
| 2019/0165810 A1* | 5/2019 | Tseng | H03M 13/1122 |

OTHER PUBLICATIONS

Zhang, et al., "An Improved Multi-Bit Threshold Flipping LDPC Decoding Algorithm", In International Journal of Computer Theory and Engineering, vol. 6, Issue 6, Dec. 1, 2014, pp. 510-514.

* cited by examiner

HIGH EFFICIENCY DATA DECODER

TECHNICAL FIELD

An embodiment of the present subject matter relates generally to data decoding and, more specifically, to a high efficiency data decoder.

BACKGROUND

A decoder is a device or program that translates encoded data into its original format (e.g., it decodes the data). The decoder receives encoded data as input and maps the encoded data to its corresponding output. Decoders are used in a variety of applications, such as video and sound data, which are decoded prior to output. For example, most DVD players include a decoder card with the sole function of decoding video data prior to output. In some instances, a decoder may not be able to map the encoded data to an output. For example, the data received by the decoder may be inaccurate due to errors reading the data. Current systems either skip this input (e.g., do not decode the data) or request that the data be retransmitted. These solutions are not optimal as they result in lower quality output or increased latency. Accordingly, improvements are needed.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

Figure 1:
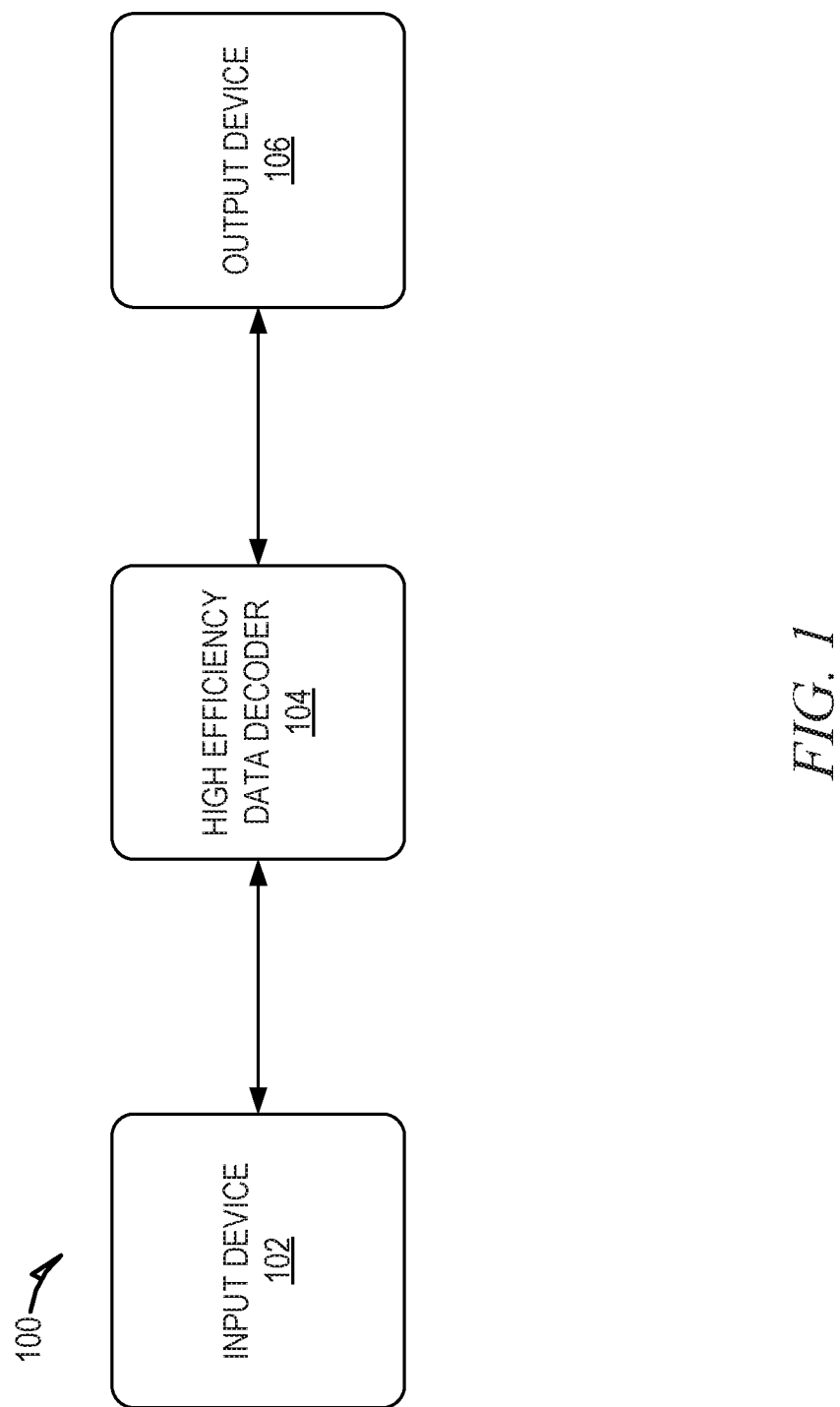
FIG. 1 is a block diagram illustrating an example system that uses a high efficiency data decoder, in accordance with some example embodiments.

In the following description, for purposes of explanation, various details are set forth in order to provide a thorough understanding of some example embodiments. It will be apparent, however, to one skilled in the art, that the present subject matter may be practiced without these specific details, or with slight alterations.

Reference in the specification to "one embodiment" or "an embodiment" means that a particular feature, structure, or characteristic described in connection with the embodiment is included in at least one embodiment of the present subject matter. Thus, the appearances of the phrase "in one embodiment" or "in an embodiment" appearing in various places throughout the specification are not necessarily all referring to the same embodiment.

For purposes of explanation, specific configurations and details are set forth in order to provide a thorough understanding of the present subject matter. However, it will be apparent to one of ordinary skill in the art that embodiments of the subject matter described may be practiced without the specific details presented herein, or in various combinations, as described herein. Furthermore, well-known features may be omitted or simplified in order not to obscure the described embodiments. Various examples may be given throughout this description. These are merely descriptions of specific embodiments. The scope or meaning of the claims is not limited to the examples given.

Disclosed are systems, methods, and non-transitory computer-readable media for a high efficiency data decoder. A high efficiency data decoder receives encoded data as input (e.g., an encoded data input) and maps the encoded data input to a data output, which is output by the high efficiency data decoder. The encoded data input is an ordered set of individual values, such as a binary number made up of an ordered set of zeroes and ones (e.g., 0001, 0010, etc.). The high efficiency data decoder uses any of a variety of data decoding techniques (e.g., bounded distance decoding) to map the encoded data input to a corresponding data output from a set of predetermined data output. Each predetermined data output is also an ordered set of individual values, although the data output may include more individual values than included in the encoded data input.

In some instances, the high efficiency data decoder may not be able to map an encoded data input to a data output. For example, the encoded data input may include an incorrect ordered set of individual values due to an error while reading or transmitting the encoded data input. Current data encoders handle this type of situation by either requesting a retransmission of the encoded data input or by simply skipping the encoded data input, which results in either increased latency or lower data output quality. The high efficiency data decoder provides an improvement to current data decoders by attempting to correct the error in the encoded data input by performing a modification to the ordered set of individual data values. The high efficiency data decoder then attempts to map the modified encoded data input to a data output. Modifying the encoded data input is faster than retransmitting the encoded data input, thereby reducing the time spent decoding the data while also providing a data output.

The modification to the encoded data input includes modifying one or more of the individual values in the ordered set of individual values. For example, the high efficiency data encoder may modify a binary number made up of an ordered set of zeroes and ones (e.g., 1001) by flipping one or more of the individual value from zero to one or vice versa (e.g., 1101). The modification may be performed randomly or, as discussed later, based on historical modification data.

The high efficiency data decoder may repeat this process by applying different modifications to the encoded data input until the high efficiency data decoder can successfully map the encoded data input to a data output and/or until a threshold period of time has elapsed. For example, the high efficiency data decoder may simply use the first successfully mapped data output as the output for the encoded data input. Alternatively, the high efficiency data decoder may repeat the process of modifying the encoded data input and attempting to map the modified encoded data input to a data output for the duration of the threshold period of time. For example, the high efficiency data decoder may perform the modifications sequentially or in parallel for the duration of the threshold period of time. Further, the subsequent modifications may be performed on the original encoded data input and/or or on a previously generated modified encoded data input.

Repeating the modification process for the threshold period of time may result in multiple instances of successfully mapping the encoded data input to a data output. In this type of situation, the high efficiency data decoder may generate a new data output (e.g., a data output that is not included in the set of predetermined data output) based on the predetermined data outputs to which the encoded data input was successfully mapped. For example, the high efficiency data decoder may compare the ordered set of individual values for each mapped data output to identify individual values that match amongst each data output. The matching individual values are included in the newly generated data output, whereas any individual values that do not match are assigned a null value in the newly generated data output. For example, if the high efficiency data decoder maps the modified encoded data inputs to the data outputs 1000 and 1100, the high efficiency data decoder may generate a data output of 1*00. The generated data output includes the individual values from each successfully mapped data output that match (e.g., the first, third and fourth values) and a null value (i.e., *) for the individual values that do not match (e.g., the second value).

As explained earlier, the high efficiency data decoder may perform the modifications to the encoded data input randomly. That is, the individual values that are modified in the ordered set of values and the modification to be performed to each value are selected randomly to generate a modified encoded data input. To increase the likelihood that the modification performed to encoded data input will result in the modified encoded data input successfully mapping to a data output, the high efficiency data decoder may select the modification based on historical modification data. The historical modification data identifies the modifications that were previously performed to encoded data inputs and whether the modification resulted in the encoded data input being successfully mapped to a data output. The historical modification data is analyzed to determine the modifications that have the highest levels of success in successful mapping to a data output. The possible data modifications are ranked based on the determined levels of success such that the data modifications determined to have the highest level of success are ranked highest. The high efficiency data decoder may perform the modifications based on the ranking, thereby increasing the likelihood that an encoded data input is successfully mapped to a data output. Individual rankings may be generated and used based in the specific input device or type of input device from which the input is received, the type of communication channel, etc.

FIG. 1 is a block diagram illustrating an example system 100 that uses a high efficiency data decoder, in accordance with some example embodiments. As shown, the system 100 includes an input device 102, a high efficiency data decoder 104 and an output device 106. The high efficiency data decoder 104 is a computing device or program implemented on a computing device that translates an encoded data input into its original format (e.g., decodes the encoded data input). For example, the high efficiency data decoder 104 receives and encoded data input and maps the encoded data input to its corresponding data output, which is then output by the high efficiency data decoder 104. A computing device can be any type of computing device and include some or all of the features, components, and peripherals of the machine 800 shown in FIG. 8.

The high efficiency data decoder 104 accesses encoded data input from the input device 102. The input device 102 may be any type of computing device, computing system, computer-readable medium, communication channel, etc., from which an encoded data input is received or read. For example, the input device 102 may be a DVD player, DVD, computer memory, computing device, communication channel, memory channel, etc. The high efficiency data decoder 104 maps the encoded data input to data output, which is output to the output device 106. The output device may also be any type of computing device or computer-readable medium capable of receiving, storing, and/or displaying the decoded data output. For example, the output device 106 may be a display device (e.g., television), computer memory, an application in computer memory, etc.

Although the shown system 100 includes only one input device 102 and output device 106, this is only for ease of explanation and is not meant to be limiting. One skilled in the art would appreciate that the system 100 can include any number of input devices 102 and output devices 106. Further, the high efficiency data decoder 104 may concurrently accept connections from and interact with any number of input devices 102 and output devices 106. The high efficiency data decoder 104 supports connections from a variety of different types of input devices 102 and output devices 106. Hence, the input devices 102 and output devices 106 may be of varying type, capabilities, operating systems, and so forth.

The encoded data input is an ordered set of individual values, such as a binary number made up of an ordered set of zeroes and ones (e.g., 0001, 0010, etc.). The high efficiency data decoder uses any of a variety of data decoding techniques (e.g., bounded distance decoding) to map the encoded data input to a corresponding data output from a set of predetermined data output. Each predetermined data output is also an ordered set of individual values, although the data output may include more individual values than the encoded data input.

In some instances, the high efficiency data decoder 104 may not be able to map an encoded data input to a data output. For example, the encoded data input may include an incorrect ordered set of individual values due to an error while reading the encoded data input from the input device 102 or during transmission of the encoded data input from the input device 102. Current data encoders handle this type of situation by either requesting a retransmission of the encoded data input or by simply skipping the encoded data input, which results in either increased latency or lower data output quality. The high efficiency data decoder 104 provides an improvement to current data decoders by attempting to correct the error in the encoded data input by performing a modification to the ordered set of individual data values. The high efficiency data decoder 104 then attempts to map the modified encoded data input to a data output. Modifying the encoded data input is faster than retransmitting the encoded data input, thereby reducing the time spent decoding the data while also providing a data output.

The modification to the encoded data input includes modifying one or more of the individual values in the ordered set of individual values. For example, the high efficiency data encoder 104 may modify a binary number made up of an ordered set of zeroes and ones (e.g., 1001) by flipping one or more of the individual value from zero to one or vice versa (e.g., 1101). The modification may be performed randomly or, as discussed later, based on historical modification data.

The high efficiency data decoder 104 may repeat this process by applying different modifications to the encoded data input until the high efficiency data decoder 104 can successfully map the encoded data input to a data output and/or until a threshold period of time has elapsed. For example, the high efficiency data decoder 104 may simply use the first successfully mapped data output as the output for the encoded data input. Alternatively, the high efficiency data decoder 104 may repeat the process of modifying the encoded data input and attempting to map the modified encoded data input to a data output for the duration of the threshold period of time. For example, the high efficiency data decoder 104 may perform the modifications sequentially or in parallel for the duration of the threshold period of time. Further, the subsequent modifications may be performed on the original encoded data input and/or on a previously generated modified encoded data input.

Repeating the modification process for the threshold period of time may result in multiple instances of successfully mapping the encoded data input to a data output. In this type of situation, the high efficiency data decoder 104 may generate a new data output (e.g., a data output that is not included in the set of predetermined data output) based on the data outputs to which the encoded data input data was successfully mapped. For example, the high efficiency data decoder 104 may compare the ordered set of individual values for each mapped data output to identify individual values that match amongst each of the data output. The matching individual values are included in the newly generated data output, whereas any individual values that do not match are assigned a null value in the newly generated data output. For example, if the high efficiency data decoder 104 maps the modified encoded data inputs to the data outputs 1000 and 1100, the high efficiency data decoder 104 may generate a new data output of 1*00. The generated data output includes the individual values from each successfully mapped data output that match (e.g., the first, third and fourth values) and a null value (i.e., *) for the individual values that do not match (e.g., the second value).

As explained earlier, the high efficiency data decoder 104 may perform the modifications to the encoded data input randomly. That is, the individual values that are modified in the ordered set values and the modification to be performed to the values are selected randomly to generate a modified encoded data input. To increase the likelihood that the modification to the encoded data input will result in the encoded data input being successfully mapped to a data output, the high efficiency data decoder 104 selects the modification to be performed to the encoded data input based on historical modification data. The historical modification data identifies the modifications that were previously performed to encoded data inputs and whether the modification resulted in the encoded data input being successfully mapped to a data output. The historical modification data is analyzed to determine the modifications that have the highest levels of success in successfully mapping an encoded data input to a data output. For example, some errors or patterns of errors may occur repeatedly. Accordingly, analyzing the historical modification data identifies these error patterns and the modifications that successfully correct them.

The possible data modifications are ranked based on the determined levels of success such that the data modifications determined to have the highest level of success are ranked highest. The high efficiency data decoder 104 may select the modifications to perform based on the ranking, thereby increasing the likelihood that an input is successfully mapped to a data output. Individual rankings may be generated and used based on the specific input device 102 or type of input device from which the encoded data input is received.

Figure 2:
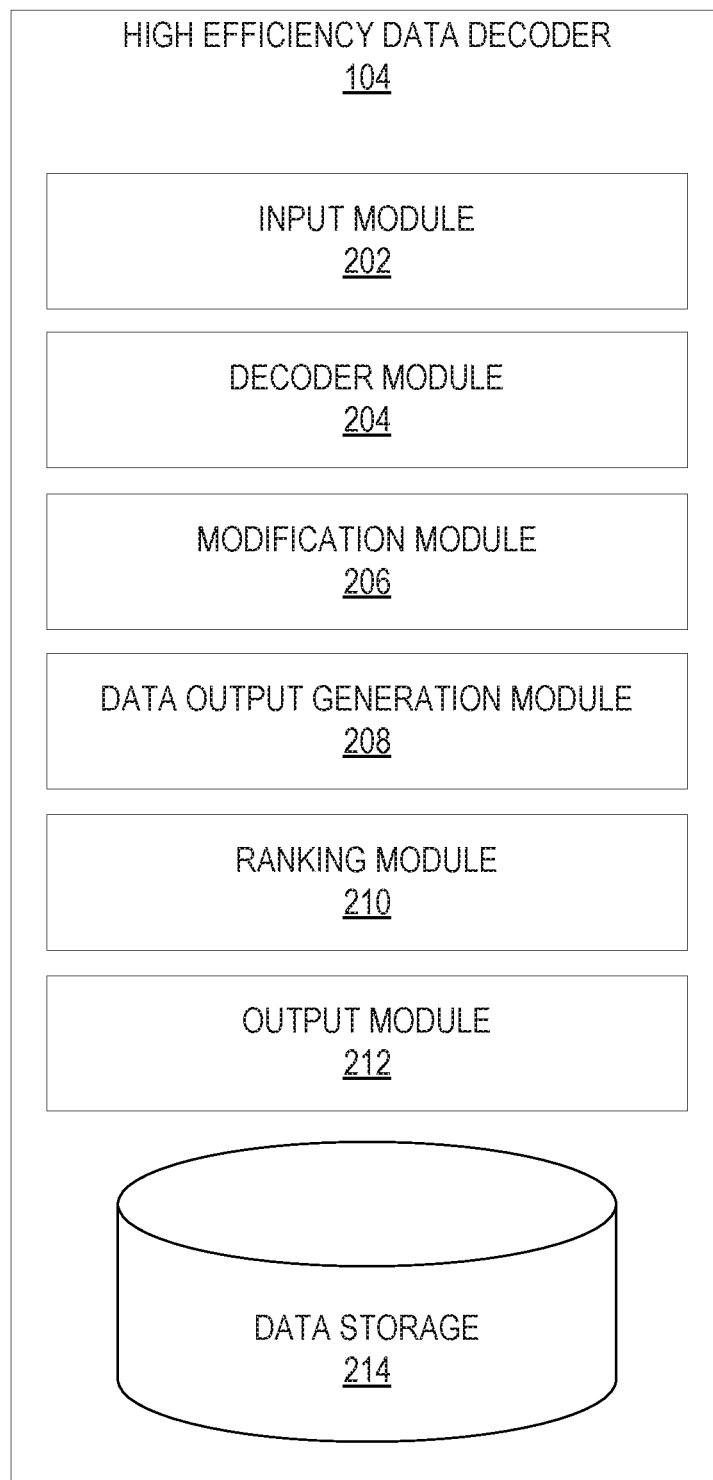
FIG. 2. is a block diagram of a high efficiency data decoder, according to some example embodiments.

FIG. 2 is a block diagram of a high efficiency data decoder 104, according to some example embodiments. To avoid obscuring the inventive subject matter with unnecessary detail, various functional components (e.g., modules) that are not germane to conveying an understanding of the inventive subject matter have been omitted from FIG. 2. However, a skilled artisan will readily recognize that various additional functional components may be supported by the high efficiency data decoder 104 to facilitate additional functionality that is not specifically described herein. Furthermore, the various functional modules depicted in FIG. 2 may reside on a single computing device or may be distributed across several computing devices in various arrangements such as those used in cloud-based architectures.

As shown, the high efficiency data decoder 104 includes an input module 202, a decoder module 204, a modification module 206, a data output generation module 208, a ranking module 210, an output module 212, and a data storage 214.

The input module 202 access encoded data input to be decoded by the high efficiency data decoder 104. An encoded data input is an ordered set of individual values, such as a binary number made up of an ordered set of zeroes and ones (e.g., 0001, 0010, etc.). The input module 202 may access the encoded data input from an input device 102. For example, the input device 102 may receive an encoded data input that is transmitted to the high efficiency data decoder 104 by the input device 102. As another example, the input module 202 may cause the encoded data input to be read from the input device 102. In either case, the input device 102 provides the encoded data input to other modules of the high efficiency data decoder 104 to be decoded into a data output.

The decoder module 204 decodes the encoded data input received from the input device 102 into a data output. For example. the decoder module 204 maps the encoded data input to one of the predetermined data outputs. Each predetermined data output is also an ordered set of individual values, although the data output may include more individual values than the encoded data input.

The decoder module 204 may decode the encoded data input using any of a variety of data decoding techniques. For example, the decoder module 204 may use bounded distance decoding to map the encoded data input to one of the predetermined data outputs. To map an encoded data input to a data output using bounded distance decoding, the decoder module 204 generates a representative input vector based on the encoded data input and determines whether the representative input vector is within a threshold distance of any representative output vectors generated based on each of the predetermined data outputs. If the decoder module 204 determines that the representative input vector is within the threshold distance of a representative output vector, the decoder module 204 maps the encoded data input to the data output corresponding to the representative output vector determined to be within the threshold distance of the representative input vector. Alternatively, if the decoder module 204 determines that the representative input vector is not within the threshold distance of any of the representative output vectors, the decoder module 204 determines that the encoded data input does not map to a data output.

In the event that the decoder module 204 cannot successfully map an encoded data input to a data output, the modification module 206 modifies the encoded data input in an attempt to successfully map the encoded data input to a data output. An encoded data input may include errors that result in the encoded data input not being successfully mapped to a data output. For example, the encoded data input may include an incorrect ordered set of individual values due to an error while reading the encoded data input from the input device 102 or during transmission of the encoded data input from the input device 102. As explained earlier, current data encoders handle this type of situation by either requesting a retransmission of the encoded data input or by simply skipping the encoded data input, which results in either increased latency or lower data output quality. The high efficiency data decoder 104 provides an improvement to current data decoders by attempting to correct the error in the encoded data input by performing a modification to the ordered set of individual data values.

The modification module 206 modifies an encoded data input by modifying one or more of the individual values in the ordered set of individual values. For example, the modification module 206 may modify a binary number made up of an ordered set of zeroes and ones (e.g., 1001) by flipping one or more of the individual values from zero to one or vice versa (e.g., 1101). As another example, the modification module 206 may modify a decimal number made up of an ordered set of values from 0-9 (e.g., 2124) by incrementing or decrementing one or more of the individual values (e.g., 2125).

The modification module 206 may perform the modifications randomly or based on a modification ranking determined based on historical modification data. For example, the modification module 206 randomly select one or more values in the ordered set of values to modify, as well as the modification to perform to each selected value. For example, given an encoded data input that is a binary number comprising of an ordered set of ones and zeros, the modification module 206 randomly selects one or more bits of the binary number to flip from one to zero or vice versa. As another example, given an encoded data input that is a decimal number comprising of an ordered set of values from 0-9, the modification module 206 randomly selects one or more values of the decimal number to modify as well as the modification to perform to each selected value (e.g., increment, decrement, etc.). In some embodiments, the modification module 206 maintains a record of the modifications performed to an encoded data input, which is used to ensure that the same modification is not performed on the encoded data input multiple times.

The modification module 206 may also perform the modifications based on a ranking of modifications that was generated based on historical modification data (described below). The ranking of modifications includes a listing of the possible modifications that is ranked based on a determined level of success for each modification that indicates how likely the modification is to result in the encoded data input being successfully mapped to a data output. The modification module 206 performs modifications to an encoded data input based on the ranked order of the modifications in the ranking of modifications. As a result, the modification module 206 performs the modifications that have the highest likelihood of resulting in the encoded data input being successfully mapped to a data output.

In some embodiments, there may be multiple rankings of modifications that are based on the specific input device or type of input device 102 from which the encoded data input is received. Accordingly, the modification module 206 accesses the ranking of modifications that corresponds to the input device 102 or type of input device from which the encoded data input is received and performs modifications to the encoded data input based on the accessed ranking of modifications.

The modification module 206 provides the modified encoded data input to the decoder module 204, which attempts to map the modified encoded data input to a data output. This process may be repeated using different modifications to the encoded data input. That is, the modification module 206 may repeat the process of modifying the encoded data input and providing the resulting modified encoded data input to the decoder module 204 until a modified encoded data input is successfully mapped to a data output and/or until a threshold period of time has elapsed. For example, the first data output successfully mapped to a modified encoded data input may be used as the data output for the encoded data input, or the process of modifying the encoded data input and attempting to map the modified encoded data input to a data output may be repeated for the duration of the threshold period of time even after a modified encoded data input has been successfully mapped to a data output. This may result in multiple instances of successfully mapping the encoded data input to a data output. The modification module 206 may perform the modifications sequentially or in parallel for the duration of the threshold period of time. Further, the subsequent modifications may be performed on the original encoded data input and/or or on a previously generated modified encoded data input.

Repeating the modification process for the threshold period of time may result in multiple instances of successfully mapping the encoded data input to a data output. In the event that an encoded data input is mapped to more than one data output, the data output generation module 208 generates a new data output (e.g., a data output that is not included in the set of predetermined data output) based on the data outputs to which the encoded data input was successfully mapped. For example, the data output generation module 208 may compare the ordered set of individual values for each mapped data output to identify individual values that match amongst each of the data output. The data output generation module 208 includes the matching individual values in the newly generated data output and assigns a null value in the newly generated data output to any of the individual values that do not match. For example, if an encoded data input is mapped to the data outputs 1000 and 1100, the data output generation module 208 generate a data output of 1*00. The generated data output includes the individual values from each successfully mapped data output that match (e.g., the first, third and fourth values) and a null value (i.e., *) for the individual values that do not match (e.g., the second value).

The ranking module 210 generates a ranking of modifications based on historical modification data. The historical modification data includes data describing modifications performed to encoded data input previously received by high efficiency data decoders 104. For example, the historical modification data may include data describing each respective encoded data input, data describing the input device 102 from which the encoded data input was received, the modification performed to the encoded data input (e.g., the values that were modified, the type of modification performed to each value, etc.), whether the modification was successful in mapping the encoded data input to a data output, etc. The historical modification data may be logged in the data storage 214.

The ranking module 210 gathers the historical modification data from the data storage 214 and analyzes the historical modification data to determine the modifications that have the highest levels of success in successful mapping an encoded data input to a data output. The ranking module 210 ranks the possible data modifications based on the determined levels of success such that the data modifications determined to have the highest level of success are ranked highest.

While the ranking module 210 is shown as being implemented as part of the high efficiency data decoder 104, this is just for ease of explanation and is not meant to be limiting. In some embodiments, the ranking module 210 is implemented on a separate device as the high efficiency data decoder 104. For example, the ranking module 210 may be a separate device that receives historical ranking data from multiple high efficiency data decoders 104, which the ranking module 210 uses to determine the ranking of modifications. The ranking module 210 may then provide the generated ranking of modifications to the high efficiency data decoders 104.

In some embodiments, the ranking module 210 may generated multiple rankings of modifications. For example, the ranking module 210 may generate a separate ranking of modifications for each specific input device 102 and/or type of input device 102. The ranking mode 210 determines the ranking of modifications for an input device 102 or type of input device based on a subset of the historical modification data that describes modifications performed to encoded data accessed from the specific input device 102 and/or the type of input device 102. The resulting rankings of modification may be stored along with metadata describing the input device 102 or type of input devices 102 to which they relate.

The output module 212 outputs the decoded data to the output device 106. For example, the output module 212 outputs that data output to which each encoded data input is mapped to the output device 106. This may include transmitting the output data to the output device 106 for presentation, causing the output data to be stored by the output device 106, etc.

Figure 3:
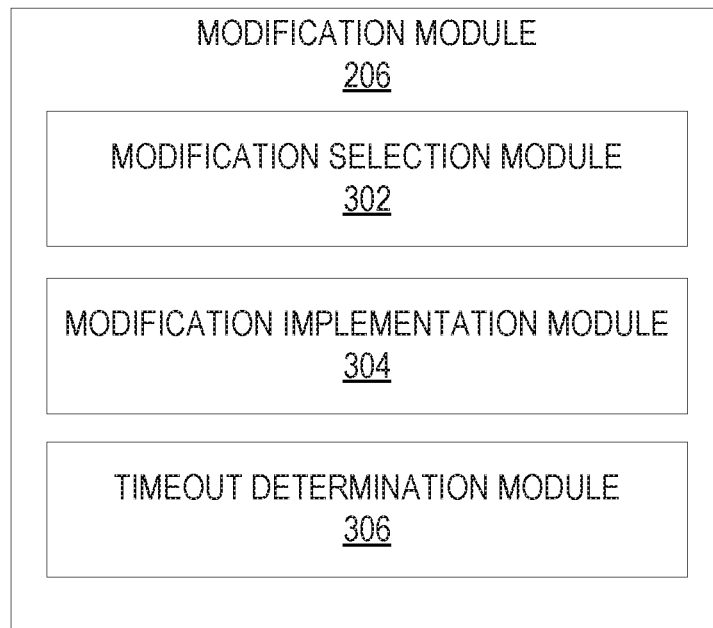
FIG. 3 is a block diagram of a modification module, according to some example embodiments.

FIG. 3 is a block diagram of a modification module 206, according to some example embodiments. To avoid obscuring the inventive subject matter with unnecessary detail, various functional components (e.g., modules) that are not germane to conveying an understanding of the inventive subject matter have been omitted from FIG. 3. However, a skilled artisan will readily recognize that various additional functional components may be supported by the modification module 206 to facilitate additional functionality that is not specifically described herein. Furthermore, the various functional modules depicted in FIG. 3 may reside on a single computing device or may be distributed across several computing devices in various arrangements such as those used in cloud-based architectures.

As shown, the modification module 206 includes a modification selection module 302, a modification implementation module 304, and a timeout determination module 306. The modification selection module 302 determines the modification to be performed on an encoded data input. The modification selection module 302 may select the modification randomly or based on a ranking of modifications. In embodiments in which the modification selection module 302 selects the modification randomly, the modification selection module 302 randomly selects one or more values from the ordered set of values to be modified as well as the type of modification to be performed to each value (e.g., increment, decrement, etc.). The modification selection module 302 may maintain a log of the previous modifications that have been performed on each encoded data input to ensure that the same modification is not performed more than once for a given encoded data input.

In embodiments in which the modification selection module 302 uses a ranking of modifications to select the modification, the modification selection module 302 accessed the ranking of modifications from the data storage 214 and selects the modifications based on their ranked order in the ranking. For example, the modification selection module 302 initially selects the top ranked modification and then continues down the ranking.

In embodiments in which there are multiple rankings of modifications based on the input device 102 and/or type of input device 102, the modification selection module 302 selects the appropriate ranking of modifications from the data storage 214. For example, the modification selection module 302 gathers data describing the input device 102, such as a unique identifier identifying the specific input device 102 or data describing the type of input device 102 and uses the gathered data to select the corresponding ranking of modifications from the data storage 214.

The modification implementation module 304 implements the modifications selected by the modification selection module 302 to the encoded data input. For example, the modification implementation module 304 adjusts the individual values in the ordered set of individual values based on the modification. For example, an encoded data input may be a binary number made up of an ordered set of zeroes and ones (e.g., 1001) and the selected modification indicates which individual bits are to be flipped (e.g., second bit). Accordingly, the modification implementation module 304 flips the identified individual values from zero to one or vice versa (e.g., 1101). As another example, an encoded data input may be a decimal number made up of an ordered set of values from 0-9 (e.g., 2124) and the selected modification indicates which values are to be modified (e.g., fourth value) and the type of modification to be performed to each value (e.g., incremented by one). Accordingly, the modification implementation module 304 modifies the identified values according to the described modification (e.g., 2125).

The timeout determination module 306 determines whether the process of modifying the encoded data input should continue to be repeated or if a timeout has occurred. As explained earlier, the process may be repeated for a threshold period of time after the initial encoded data input is accessed from the input device 102. Limiting the amount of time that the process is repeated reduces latency associated with this process. The timeout determination module 306 monitors the amount of elapsed time to determine whether the threshold period of time has elapsed (e.g., a timeout has occurred). In the event that the threshold period of time has elapsed, the timeout determination module 306 causes the modification module 206 to stop the process of modifying the encoded data input, after which the input module 202 may access another encoded data input from the input device 102.

Figure 4:
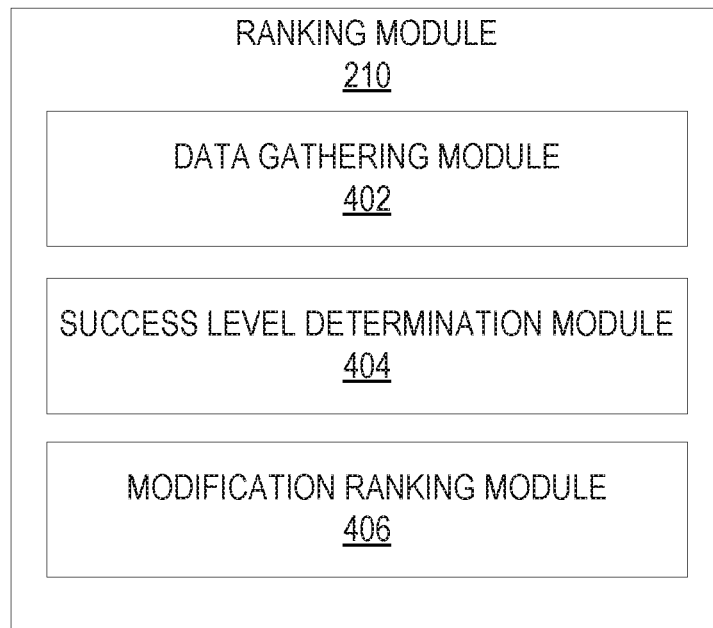
FIG. 4 is a block diagram of a ranking module, according to some example embodiments.

FIG. 4 is a block diagram of a ranking module 210, according to some example embodiments. To avoid obscuring the inventive subject matter with unnecessary detail, various functional components (e.g., modules) that are not germane to conveying an understanding of the inventive subject matter have been omitted from FIG. 4. However, a skilled artisan will readily recognize that various additional functional components may be supported by the ranking module 210 to facilitate additional functionality that is not specifically described herein. Furthermore, the various functional modules depicted in FIG. 4 may reside on a single computing device or may be distributed across several computing devices in various arrangements such as those used in cloud-based architectures.

As shown, the ranking module 210 includes a data gathering module 402, a success level determination module 404, and a modification ranking module 406.

The data gathering module 402 gathers historical modification data used to generate a ranking of modifications. The historical modification data includes data describing modifications performed to encoded data input previously received by high efficiency data decoders 104. For example, the historical modification data may include data describing each respective encoded data input, data describing the input device 102 from which the input was received, the modification performed to the encoded data input (e.g., the values that were modified, the type of modification performed to each value, etc.), whether the modification was successful in mapping the encoded data input to a data output, etc.

The data gathering module 402 gathers the historical modification data from the data storage 214. This may include all of the historical modification data or a subset of the historical modification data. For example, the data gathering module 402 may gather a subset of the historical modification data that described modifications performed to encoded data input received from a specified input device 102 or type of input device 102. The subset of historical modification data may be used to generate a ranking of modifications that is specific to the respective input device 102 or type of input device 102.

The success level determination module 404 analyzes the historical modification data gathered by the data gathering module 402 to determine a level of success each performed modification has had in mapping the encoded data input to a data output. That is, the success level determination module 404 determines how likely each modification is to result in a modified encoded data input that is successfully mapped to a data output. The success level determination module 404 determines the level of success for each modification by determining a total number of occurrences of the modification and the percentage of those occurrences that resulted in a successful mapping to a data output.

The modification ranking module 406 ranks the possible data modifications based on the level of success determined for each respective modification by the success level determination module 404. The resulting ranking of modifications ranks the data modifications from the modifications determined to have the highest level of success to the data modifications determined to have the lowest level of success. The resulting ranking of modifications may be general or specific to an input device 102 or type of input device 102 based on the historical modification data used to generate the ranking.

Figure 5:
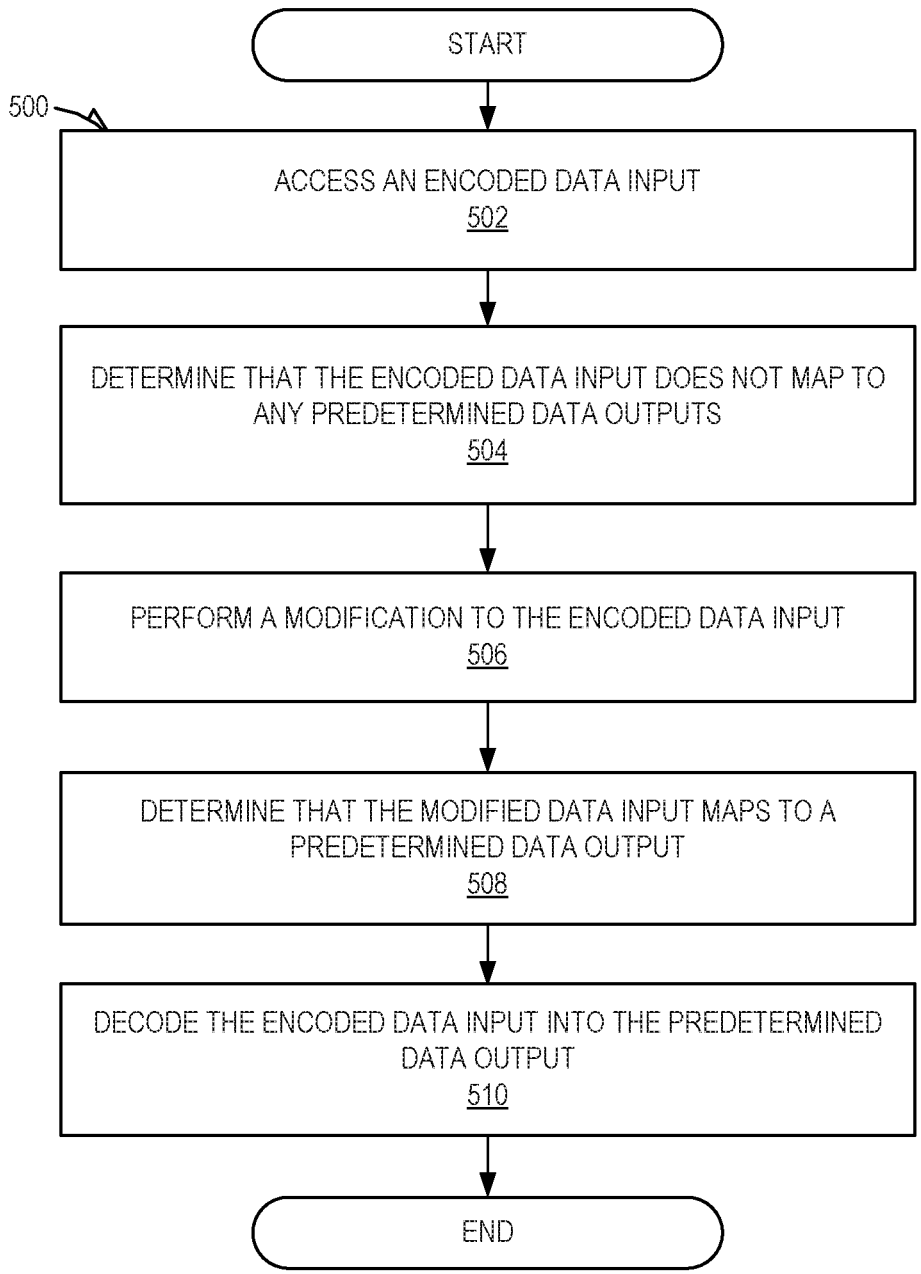
FIG. 5 is a flowchart showing an example method of decoding an input using a high efficiency data decoder, according to certain example embodiments.

FIG. 5 is a flowchart showing an example method 500 of decoding an input using a high efficiency data decoder 104, according to certain example embodiments. The method 500 may be embodied in computer readable instructions for execution by one or more processors such that the operations of the method 500 may be performed in part or in whole by the high efficiency data decoder 104; accordingly, the method 500 is described below by way of example with reference thereto. However, it shall be appreciated that at least some of the operations of the method 500 may be deployed on various other hardware configurations and the method 500 is not intended to be limited to the high efficiency data decoder 104.

At operation 502, the input module 202 accesses an encoded data input. The encoded data input is an ordered set of individual values, such as a binary number made up of an ordered set of zeroes and ones (e.g., 0001, 0010, etc.). The input module 202 may access the encoded data input from an input device 102. For example, the input device 102 may receive an encoded data input transmitted to the high efficiency data decoder 104 by the input device 102. As another example, the input module 202 may cause the encoded data input to be read from the input device 102. In either case, the input device 102 provides the encoded data to other modules of the high efficiency data decoder 104 as input to be decoded into a data output.

At operation 504, the decoder module 204 determines that the encoded data input does not map to any predetermined data outputs. The decoder module 204 may attempt to decode the encoded data input using any of a variety of data decoding techniques. For example, the decoder module 204 may use bounded distance decoding to map the encoded data input to one of the predetermined data outputs. To map an encoded data input to a data output using bounded distance decoding, the decoder module 204 generates a representative input vector based on the encoded data input and determines whether the representative input vector is within a threshold distance of any representative output vectors generated based on each of the predetermined data outputs. If the decoder module 204 determines that the representative input vector is not within the threshold distance of any of the representative output vectors, the decoder module 204 determines that the encoded data input does not map to a data output.

At operation 506, the modification module 206 performs a modification to the encoded data input. The modification module 206 modifies the encoded data input in an attempt to successfully map the encoded data input to a data output. The encoded data input may include errors that resulted in the encoded data input not being successfully mapped to a data output. For example, the encoded data input may include an incorrect ordered set of individual values due to an error while reading the encoded data input from the input device 102 or during transmission of the encoded data input from the input device 102. As explained earlier, current data encoders handle this type of situation by either requesting a retransmission of the encoded data input or by simply skipping the encoded data, which results in either increased latency or lower data output quality. The high efficiency data decoder 104 provides an improvement to current data decoders by attempting to correct the error in the encoded data by performing a modification to the ordered set of individual data values.

The modification module 206 modifies the encoded data input by modifying one or more of the individual values in the ordered set of individual values. For example, the modification module 206 may modify a binary number made up of an ordered set of zeroes and ones (e.g., 1001) by flipping one or more of the individual values from zero to one or vice versa (e.g., 1101). As another example, the modification module 206 may modify a decimal number made up of an ordered set of values from 0-9 (e.g., 2124) by incrementing or decrementing one or more of the individual values (e.g., 2125).

The modification module 206 may perform the modifications randomly or based on a modification ranking determined based on historical modification data. For example, the modification module 206 randomly select one or more values in the ordered set of values to modify, as well as the modification to perform to each selected value. For example, given an encoded data input that is a binary number comprising of an ordered set of ones and zeros, the modification module 206 randomly select one or more bits of the binary number to flip from one to zero or vice versa. As another example, given an encoded data input that is a decimal number comprising of an ordered set of values from 0-9, the modification module 206 randomly select one or more values of the decimal number to modify as well as the modification to perform to each selected value (e.g., increment, decrement, etc.). In some embodiments, the modification module 206 maintains a record of the modifications performed to an encoded data input, which is used to ensure that the same modification is not performed on the encoded data input multiple times.

The modification module 206 may also perform the modifications based on a ranking of modifications that was generated based on historical modification data. The ranking of modifications includes a listing of the possible modifications that is ranked based on a determined level of success for each modification that indicates how likely the modification is to result in the encoded data input being successfully mapped to a data output. The modification module 206 performs modifications to an encoded data input based on the ranked order of the modifications in the ranking of modifications. As a result, the modification module 206 performs the modifications that have the highest likelihood of resulting the encoded data input being successfully mapped to a data output.

In some embodiments, there may be multiple rankings of modifications that are based on the specific input device or type of input device 102 from which the encoded data is received. Accordingly, the modification module 206 accesses the ranking of modifications that corresponds to the input device 102 or type of input device from which the encoded data input is received and performs modifications to the encoded data input based on the accessed ranking of modifications.

At operation 508, the decoder module 204 determines that the modified encoded data input maps to a predetermined data output. For example, the decoder module 204 uses bounded distance decoding to map the encoded data to one of the predetermined data outputs.

At operation 510, the output module 212 decodes the encoded data input into the predetermined data output.

In some embodiments, the high efficiency data decoder 104 may repeat this method by applying different modifications to the encoded data input until a threshold period of time has elapsed. For example, the high efficiency data decoder 104 may repeat the operations of modifying the encoded data input and attempting to map the modified encoded data input to a data output for the duration of the threshold period of time. For example, the high efficiency data decoder 104 may perform the modifications sequentially or in parallel for the duration of the threshold period of time. Further, the subsequent modifications may be performed on the original encoded data input and/or or on a previously generated modified encoded data input.

Repeating the modification process for the threshold period of time may result in multiple instances of successfully mapping the encoded data input to a data output. In this type of situation, the high efficiency data decoder 104 may generate a new data output (e.g., a data output that is not included in the set of predetermined data output) based on the predetermined data outputs to which the encoded data input was successfully mapped. For example, the high efficiency data decoder 104 may compare the ordered set of individual values for each mapped data output to identify individual values that match amongst each data output. The matching individual values are included in the newly generated data output, whereas any individual values that do not match are assigned a null value in the newly generated data output. For example, if the high efficiency data decoder 104 maps the modified encoded data inputs to the data outputs 1000 and 1100, the high efficiency data decoder 104 may generate a data output of 1*00. The generated data output includes the individual values from each successfully mapped data output that match (e.g., the first, third and fourth values) and a null value (i.e., *) for the individual values that do not match (e.g., the second value).

Figure 6:
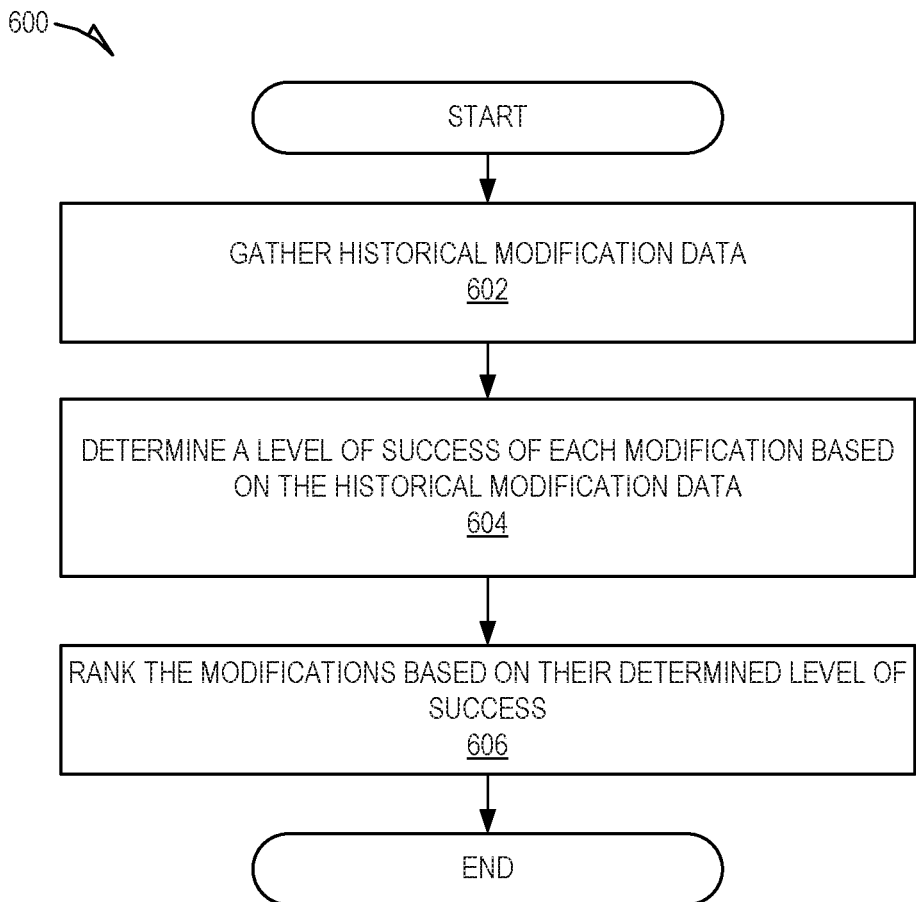
FIG. 6 is a flowchart showing an example method of generating a ranking of modifications for an input device, according to certain example embodiments.

FIG. 6 is a flowchart showing an example method 600 of generating a ranking of modifications for an input device 102, according to certain example embodiments. The method 600 may be embodied in computer readable instructions for execution by one or more processors such that the operations of the method 600 may be performed in part or in whole by the ranking module 210; accordingly, the method 600 is described below by way of example with reference thereto. However, it shall be appreciated that at least some of the operations of the method 600 may be deployed on various other hardware configurations and the method 600 is not intended to be limited to the ranking module 210.

At operation 602, the data gathering module 402 gathers historical modification data. The historical modification data includes data describing modifications performed to encoded data input that was previously received by high efficiency data decoders 104. For example, the historical modification data may include data describing each respective encoded data input, data describing the input device 102 from which the encoded data input was received, the modification performed to the encoded data input (e.g., the values that were modified, the type of modification performed to each value, etc.), whether the modification was successful in mapping the encoded data input to a data output, etc.

The data gathering module 402 gathers the historical modification data from the data storage 214. This may include all of the historical modification data or a subset of the historical modification data. For example, the data gathering module 402 may gather a subset of the historical modification data that described modifications performed to encoded data input received from a specified input device 102 or type of input device 102. The subset of historical modification data may be used to generate a ranking of modifications that is specific to the respective input device 102 or type of input device 102.

At operation 604, the success level determination module 404 determines a level of success of each modification based on the historical modification data. That is, the success level determination module 404 determines how likely each modification is to result in a modified encoded data input that is successfully mapped to a data output. The success level determination module 404 determines the level of success for each modification by determining a total number of occurrences of the modification and the percentage of those occurrences that resulted in a successful mapping to a data output.

At operation 606, the modification ranking module 406 ranks the modifications based on their determined level of success. The resulting ranking of modifications ranks the data modifications from the modifications determined to have the highest level of success to the data modifications determined to have the lowest level of success. The resulting ranking of modifications may be general or specific to an input device 102 or type of input device 102 based on the historical modification data used to generate the ranking.

Software Architecture

Figure 7:
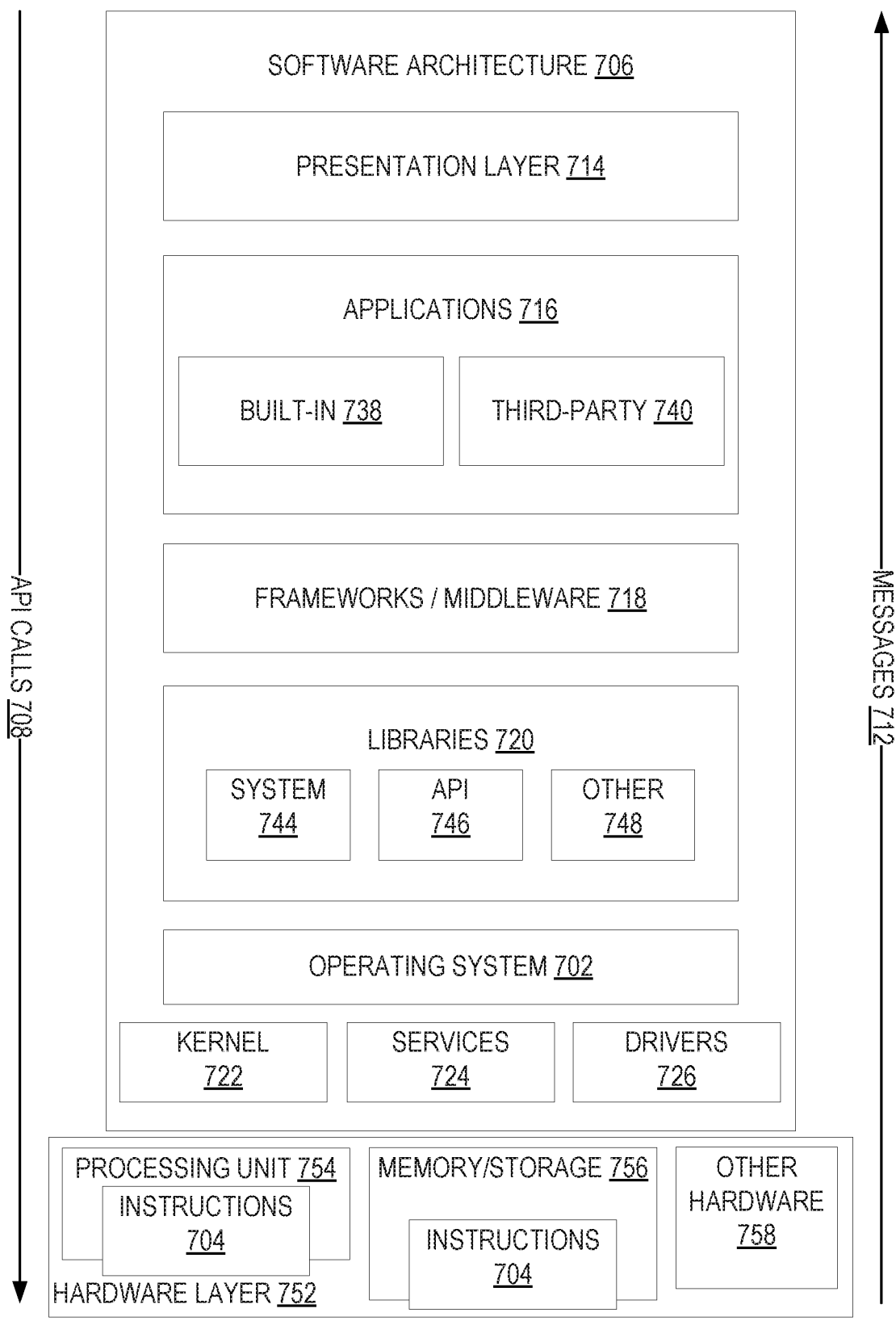
FIG. 7 is a block diagram illustrating a representative software architecture, which may be used in conjunction with various hardware architectures herein described.

FIG. 7 is a block diagram illustrating an example software architecture 706, which may be used in conjunction with various hardware architectures herein described. FIG. 7 is a non-limiting example of a software architecture 706 and it will be appreciated that many other architectures may be implemented to facilitate the functionality described herein. The software architecture 706 may execute on hardware such as machine 800 of FIG. 8 that includes, among other things, processors 804, memory 814, and (input/output) I/O components 818. A representative hardware layer 752 is illustrated and can represent, for example, the machine 800 of FIG. 8. The representative hardware layer 752 includes a processing unit 754 having associated executable instructions 704. Executable instructions 704 represent the executable instructions of the software architecture 706, including implementation of the methods, components, and so forth described herein. The hardware layer 752 also includes memory and/or storage modules 756, which also have executable instructions 704. The hardware layer 752 may also comprise other hardware 758.

In the example architecture of FIG. 7, the software architecture 706 may be conceptualized as a stack of layers where each layer provides particular functionality. For example, the software architecture 706 may include layers such as an operating system 702, libraries 720, frameworks/middleware 718, applications 716, and a presentation layer 714. Operationally, the applications 716 and/or other components within the layers may invoke application programming interface (API) calls 708 through the software stack and receive a response such as messages 712 in response to the API calls 708. The layers illustrated are representative in nature and not all software architectures have all layers. For example, some mobile or special purpose operating systems may not provide a frameworks/middleware 718, while others may provide such a layer. Other software architectures may include additional or different layers.

The operating system 702 may manage hardware resources and provide common services. The operating system 702 may include, for example, a kernel 722, services 724, and drivers 726. The kernel 722 may act as an abstraction layer between the hardware and the other software layers. For example, the kernel 722 may be responsible for memory management, processor management (e.g., scheduling), component management, networking, security settings, and so on. The services 724 may provide other common services for the other software layers. The drivers 726 are responsible for controlling or interfacing with the underlying hardware. For instance, the drivers 726 include display drivers, camera drivers, Bluetooth® drivers, flash memory drivers, serial communication drivers (e.g., Universal Serial Bus (USB) drivers), Wi-Fi® drivers, audio drivers, power management drivers, and so forth, depending on the hardware configuration.

The libraries 720 provide a common infrastructure that is used by the applications 716 and/or other components and/or layers. The libraries 720 provide functionality that allows other software components to perform tasks in an easier fashion than to interface directly with the underlying operating system 702 functionality (e.g., kernel 722, services 724, and/or drivers 726). The libraries 720 may include system libraries 744 (e.g., C standard library) that may provide functions such as memory allocation functions, string manipulation functions, mathematical functions, and the like. In addition, the libraries 720 may include API libraries 746 such as media libraries (e.g., libraries to support presentation and manipulation of various media format such as MPEG4, H.264, MP3, AAC, AMR, JPG, PNG), graphics libraries (e.g., an OpenGL framework that may be used to render 2D and 3D in a graphic content on a display), database libraries (e.g., SQLite that may provide various relational database functions), web libraries (e.g., WebKit that may provide web browsing functionality), and the like. The libraries 720 may also include a wide variety of other libraries 748 to provide many other APIs to the applications 716 and other software components/modules.

The frameworks/middleware 718 (also sometimes referred to as middleware) provide a higher-level common infrastructure that may be used by the applications 716 and/or other software components/modules. For example, the frameworks/middleware 718 may provide various graphical user interface (GUI) functions, high-level resource management, high-level location services, and so forth. The frameworks/middleware 718 may provide a broad spectrum of other APIs that may be used by the applications 716 and/or other software components/modules, some of which may be specific to a particular operating system 702 or platform.

The applications 716 include built-in applications 738 and/or third-party applications 740. Examples of representative built-in applications 738 may include, but are not limited to, a contacts application, a browser application, a book reader application, a location application, a media application, a messaging application, and/or a game application. Third-party applications 740 may include an application developed using the ANDROID™ or IOS™ software development kit (SDK) by an entity other than the vendor of the particular platform, and may be mobile software running on a mobile operating system such as IOS™, ANDROID™, WINDOWS® Phone, or other mobile operating systems. The third-party applications 740 may invoke the API calls 708 provided by the mobile operating system (such as operating system 702) to facilitate functionality described herein.

The applications 716 may use built in operating system functions (e.g., kernel 722, services 724, and/or drivers 726), libraries 720, and frameworks/middleware 718 to create UIs to interact with users of the system. Alternatively, or additionally, in some systems, interactions with a user may occur through a presentation layer, such as presentation layer 714. In these systems, the application/component "logic" can be separated from the aspects of the application/component that interact with a user.

Figure 8:
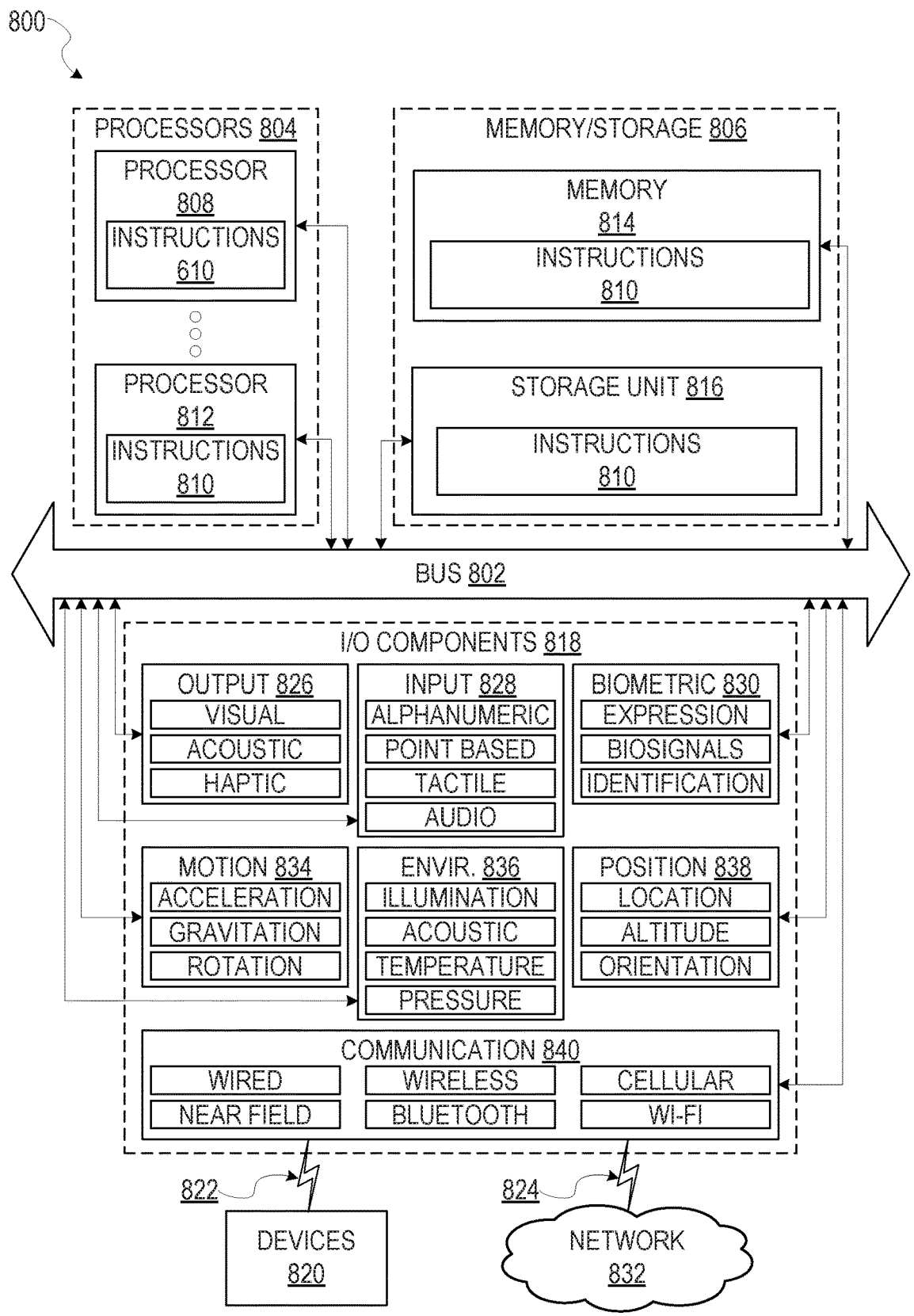
FIG. 8 is a block diagram illustrating components of a machine, according to some example embodiments, able to read instructions from a machine-readable medium (e.g., a machine-readable storage medium) and perform any one or more of the methodologies discussed herein.

FIG. 8 is a block diagram illustrating components of a machine 800, according to some example embodiments, able to read instructions 704 from a machine-readable medium (e.g., a machine-readable storage medium) and perform any one or more of the methodologies discussed herein. Specifically, FIG. 8 shows a diagrammatic representation of the machine 800 in the example form of a computer system, within which instructions 810 (e.g., software, a program, an application, an applet, an app, or other executable code) for causing the machine 800 to perform any one or more of the methodologies discussed herein may be executed. As such, the instructions 810 may be used to implement modules or components described herein. The instructions 810 transform the general, non-programmed machine 800 into a particular machine 800 programmed to carry out the described and illustrated functions in the manner described. In alternative embodiments, the machine 800 operates as a standalone device or may be coupled (e.g., networked) to other machines. In a networked deployment, the machine 800 may operate in the capacity of a server machine or a client machine in a server-client network environment, or as a peer machine in a peer-to-peer (or distributed) network environment. The machine 800 may comprise, but not be limited to, a server computer, a client computer, a PC, a tablet computer, a laptop computer, a netbook, a set-top box (STB), a personal digital assistant (PDA), an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine 800 capable of executing the instructions 810, sequentially or otherwise, that specify actions to be taken by machine 800. Further, while only a single machine 800 is illustrated, the term "machine" shall also be taken to include a collection of machines that individually or jointly execute the instructions 810 to perform any one or more of the methodologies discussed herein.

The machine 800 may include processors 804, memory/storage 806, and I/O components 818, which may be configured to communicate with each other such as via a bus 802. The memory/storage 806 may include a memory 814, such as a main memory, or other memory storage, and a storage unit 816, both accessible to the processors 804 such as via the bus 802. The storage unit 816 and memory 814 store the instructions 810 embodying any one or more of the methodologies or functions described herein. The instructions 810 may also reside, completely or partially, within the memory 814, within the storage unit 816, within at least one of the processors 804 (e.g., within the processor's cache memory), or any suitable combination thereof, during execution thereof by the machine 800. Accordingly, the memory 814, the storage unit 816, and the memory of processors 804 are examples of machine-readable media.

The I/O components 818 may include a wide variety of components to receive input, provide output, produce output, transmit information, exchange information, capture measurements, and so on. The specific I/O components 818 that are included in a particular machine 800 will depend on the type of machine. For example, portable machines such as mobile phones will likely include a touch input device or other such input mechanisms, while a headless server machine will likely not include such a touch input device. It will be appreciated that the I/O components 818 may include many other components that are not shown in FIG. 8. The I/O components 818 are grouped according to functionality merely for simplifying the following discussion and the grouping is in no way limiting. In various example embodiments, the I/O components 818 may include output components 826 and input components 828. The output components 826 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 828 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or other pointing instrument), tactile input components (e.g., a physical button, a touch screen that provides location and/or force of touches or touch gestures, or other tactile input components), audio input components (e.g., a microphone), and the like.

In further example embodiments, the I/O components 818 may include biometric components 830, motion components 834, environmental components 836, or position components 838 among a wide array of other components. For example, the biometric components 830 may include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram based identification), and the like. The motion components 834 may include acceleration sensor components (e.g., accelerometer), gravitation sensor components, rotation sensor components (e.g., gyroscope), and so forth. The environmental components 836 may include, for example, illumination sensor components (e.g., photometer), temperature sensor components (e.g., one or more thermometer that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detect concentrations of hazardous gases for safety or to measure pollutants in the atmosphere), or other components that may provide indications, measurements, or signals corresponding to a surrounding physical environment. The position components 838 may include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 818 may include communication components 840 operable to couple the machine 800 to a network 832 or devices 820 via coupling 824 and coupling 822, respectively. For example, the communication components 840 may include a network interface component or other suitable device to interface with the network 832. In further examples, communication components 840 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 820 may be another machine or any of a wide variety of peripheral devices (e.g., a peripheral device coupled via a USB).

Moreover, the communication components 840 may detect identifiers or include components operable to detect identifiers. For example, the communication components 840 may include radio frequency identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 840 such as location via Internet Protocol (IP) geo-location, location via Wi-Fi® signal triangulation, location via detecting a NFC beacon signal that may indicate a particular location, and so forth.

Glossary

"CARRIER SIGNAL" in this context refers to any intangible medium that is capable of storing, encoding, or carrying instructions 810 for execution by the machine 800, and includes digital or analog communications signals or other intangible medium to facilitate communication of such instructions 810. Instructions 810 may be transmitted or received over the network 832 using a transmission medium via a network interface device and using any one of a number of well-known transfer protocols.

"CLIENT DEVICE" in this context refers to any machine 800 that interfaces to a communications network 832 to obtain resources from one or more server systems or other client devices 102, 104. A client device 102, 104 may be, but is not limited to, mobile phones, desktop computers, laptops, PDAs, smart phones, tablets, ultra books, netbooks, laptops, multi-processor systems, microprocessor-based or programmable consumer electronics, game consoles, STBs, or any other communication device that a user may use to access a network 832.

"COMMUNICATIONS NETWORK" in this context refers to one or more portions of a network 832 that may be an ad hoc network, an intranet, an extranet, a virtual private network (VPN), a LAN, a wireless LAN (WLAN), a WAN, a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a Wi-Fi® network, another type of network, or a combination of two or more such networks. For example, a network 832 or a portion of a network 832 may include a wireless or cellular network and the coupling may be a Code Division Multiple Access (CDMA) connection, a Global System for Mobile communications (GSM) connection, or other type of cellular or wireless coupling. In this example, the coupling may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard setting organizations, other long range protocols, or other data transfer technology.

"MACHINE-READABLE MEDIUM" in this context refers to a component, device or other tangible media able to store instructions 810 and data temporarily or permanently and may include, but is not be limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store instructions 810. The term "machine-readable medium" shall also be taken to include any medium, or combination of multiple media, that is capable of storing instructions 810 (e.g., code) for execution by a machine 800, such that the instructions 810, when executed by one or more processors 804 of the machine 800, cause the machine 800 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" refers to "non-transitory" machine-readable mediums and excludes signals or other "transitory" computer readable mediums. A "non-transitory" machine-readable medium is a physical device that can store data for a period of time during which the stored data may be transferrable or reproducible. Examples of a non-transitory machine-readable medium are a physical memory device, Random Access Memory (RAM), etc. In contrast, transitory machine-readable mediums are not physical and store data only momentarily, such as a signal.

"COMPONENT" in this context refers to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various example embodiments, one or more computer systems (e.g., a standalone computer system, a client computer system, or a server computer system) or one or more hardware components of a computer system (e.g., a processor or a group of processors 804) may be configured by software (e.g., an application 716 or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application specific integrated circuit (ASIC). A hardware component may also include programmable logic or circuitry that is temporarily configured by software to perform certain operations. For example, a hardware component may include software executed by a general-purpose processor 804 or other programmable processor 804. Once configured by such software, hardware components become specific machines 800 (or specific components of a machine 800) uniquely tailored to perform the configured functions and are no longer general-purpose processors 804. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component" (or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware components are temporarily configured (e.g., programmed), each of the hardware components need not be configured or instantiated at any one instance in time. For example, where a hardware component comprises a general-purpose processor 804 configured by software to become a special-purpose processor, the general-purpose processor 804 may be configured as respectively different special-purpose processors (e.g., comprising different hardware components) at different times. Software accordingly configures a particular processor or processors 804, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses 802) between or among two or more of the hardware components. In embodiments in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors 804 that are temporarily configured (e.g., by software) or permanently configured to perform the relevant operations. Whether temporarily or permanently configured, such processors 804 may constitute processor-implemented components that operate to perform one or more operations or functions described herein. As used herein, "processor-implemented component" refers to a hardware component implemented using one or more processors 804. Similarly, the methods described herein may be at least partially processor-implemented, with a particular processor or processors 804 being an example of hardware. For example, at least some of the operations of a method may be performed by one or more processors 804 or processor-implemented components. Moreover, the one or more processors 804 may also operate to support performance of the relevant operations in a "cloud computing" environment or as a "software as a service" (SaaS). For example, at least some of the operations may be performed by a group of computers (as examples of machines 800 including processors 804), with these operations being accessible via a network 832 (e.g., the Internet) and via one or more appropriate interfaces (e.g., an API). The performance of certain of the operations may be distributed among the processors 804, not only residing within a single machine 800, but deployed across a number of machines 800. In some example embodiments, the processors 804 or processor-implemented components may be located in a single geographic location (e.g., within a home environment, an office environment, or a server farm). In other example embodiments, the processors 804 or processor-implemented components may be distributed across a number of geographic locations.

"PROCESSOR" in this context refers to any circuit or virtual circuit (a physical circuit emulated by logic executing on an actual processor 804) that manipulates data values according to control signals (e.g., "commands," "op codes," "machine code," etc.) and which produces corresponding output signals that are applied to operate a machine 800. A processor 804 may be, for example, a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC) or any combination thereof. A processor 804 may further be a multi-core processor having two or more independent processors 804 (sometimes referred to as "cores") that may execute instructions 810 contemporaneously.

What is claimed is:

1. A method performed by a data decoder implemented on a computing device, the method comprising:
   receiving, from a first input device, an encoded data input, the encoded data input including an ordered set of individual values;
   determining that the encoded data input does not map to any predetermined data outputs from a set of predetermined data outputs;
   selecting, based on a ranking of modifications for the first input device, a first modification to perform on the encoded data input, the first modification including modifying at least a first individual value from the ordered set of individual values;
   performing the first modification on the encoded data input, yielding a modified encoded data input; and
   if the modified encoded data input maps to a first data output from the set of predetermined data outputs, decoding the encoded data input into the first data output.

2. The method of claim 1, further comprising:
   generating the ranking of modifications for the first input device based on historical modification data for the first input device, the historical modification data for the first input device identifying modifications performed to encoded data inputs previously received from the first input device and whether the modifications were successful in mapping each respective encoded data input previously received from the first input device to any predetermined data outputs from the set of predetermined data outputs.

3. The method of claim 2, wherein generating the ranking of modifications for the first input device comprises:
   determining, based on the historical modification data for the first input device, the modifications performed to encoded data inputs previously received from the first input device;
   ranking each respective modification performed to encoded data inputs previously received from the first input device based on a determined success rate of the respective modification in resulting a successful mapping to any predetermined data outputs from the set of predetermined data outputs.

4. The method of claim 1, further comprising:
   if the modified encoded data input does not map to any predetermined data outputs from the set of predetermined data outputs, selecting, based on the ranking of modifications for the first input medium, a second modification to be performed to the encoded data input, the second modification being ranked lower than the first modification in the ranking of modifications for the first input device, wherein the second modification includes modifying at least a second individual value from the ordered set of individual values;

performing the second modification on the encoded data input, yielding a second modified encoded data input; and if the second modified encoded data input maps to the first data output from the set of predetermined data outputs, decoding the encoded data input into the first data output.

5. The method of claim 1, further comprising:

receiving a second encoded data input from a second input device, the second input device being different than the first input device;

determining that the second encoded data input does not map to any predetermined data outputs from the set of predetermined data outputs;

determining, based on a ranking of modifications for the second input device, a second modification to be performed to the second encoded data input;

performing the second modification on the second encoded data input, yielding a modified encoded data input; and if the second modified encoded data input maps to the first data output from the set of predetermined data outputs, decoding the second encoded data input into the first data output.

6. The method of claim 5, further comprising:

generating the ranking of modifications for the second input device based on historical modification data for the second input device, the historical modification data for the second input device identifying modifications performed to encoded data inputs previously received from the second input device and whether the modifications were successful in mapping each respective encoded data input previously received from the second input device to any predetermined data outputs from the set of predetermined data outputs.

7. The method of claim 1, wherein the first input device is a first computing device.

8. The method of claim 1, wherein the first input device is a memory channel.

9. The method of claim 1, wherein the first input device is a communication channel.

10. A system comprising:

one or more computer processors; and one or more machine-readable mediums storing instructions that, when executed by the one or more computer processors, cause the system to perform operations comprising:

receiving, from a first input device, an encoded data input, the encoded data input including an ordered set of individual values;

determining that the encoded data input does not map to any predetermined data outputs from a set of predetermined data outputs;

selecting, based on a ranking of modifications for the first input device, a first modification to perform on the encoded data input, the first modification including modifying at least a first individual value from the ordered set of individual values;

performing the first modification on the encoded data input, yielding a modified encoded data input; and if the modified encoded data input maps to a first data output from the set of predetermined data outputs, decoding the encoded data input into the first data output.

11. The system of claim 10, the operations further comprising:

generating the ranking of modifications for the first input device based on historical modification data for the first input device, the historical modification data for the first input device identifying modifications performed to encoded data inputs previously received from the first input device and whether the modifications were successful in mapping each respective encoded data input previously received from the first input device to any predetermined data outputs from the set of predetermined data outputs.

12. The system of claim 11, wherein generating the ranking of modifications for the first input device comprises:

determining, based on the historical modification data for the first input device, the modifications performed to encoded data inputs previously received from the first input device;

ranking each respective modification performed to encoded data inputs previously received from the first input device based on a determined success rate of the respective modification in resulting a successful mapping to any predetermined data outputs from the set of predetermined data outputs.

13. The system of claim 10, the operations further comprising:

if the modified encoded data input does not map to any predetermined data outputs from the set of predetermined data outputs, selecting, based on the ranking of modifications for the first input medium, a second modification to be performed to the encoded data input, the second modification being ranked lower than the first modification in the ranking of modifications for the first input device, wherein the second modification includes modifying at least a second individual value from the ordered set of individual values;

performing the second modification on the encoded data input, yielding a second modified encoded data input; and if the second modified encoded data input maps to the first data output from the set of predetermined data outputs, decoding the encoded data input into the first data output.

14. The system of claim 10, the operations further comprising:

receiving a second encoded data input from a second input device, the second input device being different than the first input device;

determining that the second encoded data input does not map to any predetermined data outputs from the set of predetermined data outputs;

determining, based on a ranking of modifications for the second input device, a second modification to be performed to the second encoded data input;

performing the second modification on the second encoded data input, yielding a modified encoded data input; and if the second modified encoded data input maps to the first data output from the set of predetermined data outputs, decoding the second encoded data input into the first data output.

15. The system of claim 14, the operations further comprising:

generating the ranking of modifications for the second input device based on historical modification data for the second input device, the historical modification data for the second input device identifying modifications performed to encoded data inputs previously received from the second input device and whether the modifications were successful in mapping each respective encoded data input previously received from the second input device to any predetermined data outputs from the set of predetermined data outputs.

16. The system of claim 10, wherein the first input device is a first computing device.

17. The system of claim 10, wherein the first input device is a memory channel.

18. The system of claim 10, wherein the first input device is a communication channel.

19. A machine-readable medium storing instructions that, when executed by one or more computer processors of a computing system, cause the computing system to perform operations comprising:
   receiving, from a first input device, an encoded data input, the encoded data input including an ordered set of individual values;
   determining that the encoded data input does not map to any predetermined data outputs from a set of predetermined data outputs;
   selecting, based on a ranking of modifications for the first input device, a first modification to perform on the encoded data input, the first modification including modifying at least a first individual value from the ordered set of individual values;
   performing the first modification on the encoded data input, yielding a modified encoded data input; and
   if the modified encoded data input maps to a first data output from the set of predetermined data outputs, decoding the encoded data input into the first data output.

20. The machine-readable medium of claim 19, the operations further comprising:
   generating the ranking of modifications for the first input device based on historical modification data for the first input device, the historical modification data for the first input device identifying modifications performed to encoded data inputs previously received from the first input device and whether the modifications were successful in mapping each respective encoded data input previously received from the first input device to any predetermined data outputs from the set of predetermined data outputs.

* * * * *